(12) United States Patent
Zhang et al.

(10) Patent No.: US 11,990,530 B2
(45) Date of Patent: May 21, 2024

(54) REPLACEMENT-CHANNEL FABRICATION OF III-V NANOSHEET DEVICES

(71) Applicant: INTERNATIONAL BUSINESS MACHINES CORPORATION, Armonk, NY (US)

(72) Inventors: Jingyun Zhang, Albany, NY (US); Choonghyun Lee, Chigasaki (JP); Chun Wing Yeung, Portland, OR (US); Robin Hsin Kuo Chao, Portland, OR (US); Heng Wu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 18/317,165

(22) Filed: May 15, 2023

(65) Prior Publication Data

US 2023/0282728 A1 Sep. 7, 2023

Related U.S. Application Data

(60) Continuation of application No. 17/346,869, filed on Jun. 14, 2021, now Pat. No. 11,742,409, which is a
(Continued)

(51) Int. Cl.
*H01L 21/02* (2006.01)
*H01L 21/306* (2006.01)
(Continued)

(52) U.S. Cl.
CPC .. *H01L 29/66522* (2013.01); *H01L 21/02532* (2013.01); *H01L 21/02546* (2013.01);
(Continued)

(58) Field of Classification Search
CPC ......... H01L 21/02532; H01L 21/02546; H01L 21/02609; H01L 21/3065; H01L 29/66522;
(Continued)

(56) References Cited

U.S. PATENT DOCUMENTS

| 8,679,902 B1 | 3/2014 | Basker et al. |
| 8,765,563 B2 | 7/2014 | Pillarisetty et al. |

(Continued)

OTHER PUBLICATIONS

Borg, "Vertical III-V Device Integration on Si(100)", Nano Letter vol. 14, Iss. 4, Mar. 2014, pp. 1914-1920.
(Continued)

*Primary Examiner* — Omar F Mojaddedi
(74) *Attorney, Agent, or Firm* — Tutunjian & Bitetto, P.C.; Kimberly Zillig

(57) ABSTRACT

Semiconductor devices and methods of forming the same include forming a stack of alternating first and second sacrificial layers. The first sacrificial layers are recessed relative to the second sacrificial layers. Replacement channel layers are grown from sidewalls of the first sacrificial layers. A first source/drain region is grown from the replacement channel layer. The recessed first sacrificial layers are etched away. A second source/drain region is grown from the replacement channel layer. The second sacrificial layers are etched away. A gate stack is formed between and around the replacement channel layers.

20 Claims, 8 Drawing Sheets

Related U.S. Application Data division of application No. 15/918,548, filed on Mar. 12, 2018, now Pat. No. 11,081,567.

(51) Int. Cl.
  *H01L 21/3065* (2006.01)
  *H01L 29/423* (2006.01)
  *H01L 29/66* (2006.01)
  *H01L 29/786* (2006.01)

(52) U.S. Cl.
  CPC .... *H01L 21/02609* (2013.01); *H01L 21/3065* (2013.01); *H01L 29/42392* (2013.01); *H01L 29/66469* (2013.01); *H01L 29/6653* (2013.01); *H01L 29/78696* (2013.01); *H01L 29/66545* (2013.01)

(58) Field of Classification Search
  CPC ........... H01L 29/42392; H01L 29/6653; H01L 29/78696
  See application file for complete search history.

(56) References Cited

U.S. PATENT DOCUMENTS

| | | | |
|---|---|---|---|
| 9,123,790 | B2 | 9/2015 | Pillarisetty et al. |
| 9,437,502 | B1 | 9/2016 | Cheng et al. |
| 9,570,551 | B1* | 2/2017 | Balakrishnan .... H01L 21/02603 |
| 9,659,829 | B1 | 5/2017 | Balakrishnan et al. |
| 9,947,804 | B1* | 4/2018 | Frougier ........... H01L 29/66439 |
| 2011/0031473 | A1* | 2/2011 | Chang .................... H01L 21/84 257/E27.098 |
| 2013/0270512 | A1 | 10/2013 | Radosavijevic et al. |
| 2014/0339611 | A1* | 11/2014 | Leobandung ..... H01L 29/42364 257/288 |
| 2015/0123215 | A1* | 5/2015 | Obradovic ........ H01L 29/78696 257/410 |
| 2015/0295084 | A1* | 10/2015 | Obradovic ........ H01L 29/78696 257/347 |
| 2017/0005195 | A1* | 1/2017 | Ching ............... H01L 29/78696 |
| 2017/0069481 | A1* | 3/2017 | Doris ................ H01L 21/02603 |
| 2019/0058036 | A1* | 2/2019 | Smith ................ H01L 29/0669 |
| 2019/0058052 | A1* | 2/2019 | Frougier ........... H01L 21/31111 |

OTHER PUBLICATIONS

Tomioka, "Sub 60 mV/decade Switch Using an InAs Nanowire-Si Heterojunction and Turn-on Voltage Shift with a Pulsed Doping Technique", vol. 13, Iss. 12, Nov. 2013, pp. 5822-5826.
List of IBM Patents or Patent Applications Treated as Related dated May 15, 2023, 2 pages.

* cited by examiner

REPLACEMENT-CHANNEL FABRICATION OF III-V NANOSHEET DEVICES

BACKGROUND

Technical Field

The present invention generally relates to semiconductor device fabrication and, more particularly, to a replacement-channel process for fabricating nanosheet devices with III-V semiconductor materials.

Description of the Related Art

While semiconductor devices, such as field effect transistors (FETs) are commonly formed with group IV semiconductors, the use of III-V semiconductor materials can be desirable to achieve high performance with low power consumption. Existing processes for fabricating III-V semiconductor devices are generally built around an indium phosphate substrate, which is substantially more expensive than using conventional silicon substrates.

SUMMARY

A method for forming a semiconductor device includes forming a stack of alternating first and second sacrificial layers. The first sacrificial layers are recessed relative to the second sacrificial layers. Replacement channel layers are grown from sidewalls of the first sacrificial layers. A first source/drain region is grown from the replacement channel layer. The recessed first sacrificial layers are etched away. A second source/drain region is grown from the replacement channel layer. The second sacrificial layers are etched away. A gate stack is formed between and around the replacement channel layers.

A method for forming a semiconductor device includes forming a stack of alternating first and second sacrificial layers. Top surfaces of the first and second alternating layers have a (111) crystal orientation. The first sacrificial layers are recessed relative to the second sacrificial layers. A protective layer is formed on the second sacrificial layers, leaving sidewalls of the first sacrificial layers exposed with a crystal orientation of (110). Replacement channel layers are grown from sidewalls of the first sacrificial layers after forming the protective layer. A first source/drain region is grown from the replacement channel layer. The recessed first sacrificial layers are etched away. A second source/drain region is grown from the replacement channel layer. Second sacrificial layers are etched away. A gate stack is formed between and around the replacement channel layers.

A semiconductor device includes one or more III-V semiconductor channel layers formed over a group IV semiconductor substrate. III-V semiconductor source and drain regions are epitaxially grown from the one or more III-V semiconductor channel layers. A gate stack is formed around the one or more III-V semiconductor channel layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a channel-replacement fabrication process for the fabrication of semiconductor devices (such as field effect transistors (FETs)) that use III-V semiconductor materials for active structures on a substrate formed from a conventional group IV semiconductor material. To accomplish this, the present embodiments employ selective growth of III-V structures from specific crystal faces of group IV semiconductor structures and then replacing those group IV semiconductor structures with additional III-V material.

As used herein, the term "III-V material," or "III-V semiconductor" refers to a semiconductor material that includes at least one element from Group III of the Periodic Table of Elements (i.e., International Union of Pure and Applied Chemistry (IUPAC) group 13) and at least one element from Group V of the Periodic Table of Elements (i.e., IUPAC group 15). This contrasts to group IV semiconductors, which are formed from a single element in group IV of the Periodic Table of Elements (i.e., IUPAC group 14) such as, e.g., silicon, germanium, and compounds thereof. Typically, the III-V compound semiconductors are binary, ternary or quaternary alloys including III/V elements. Examples of III-V compound semiconductors that can be used in the present invention include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus, cadmium telluride, zinc selenide, and combinations thereof.

Figure 1:
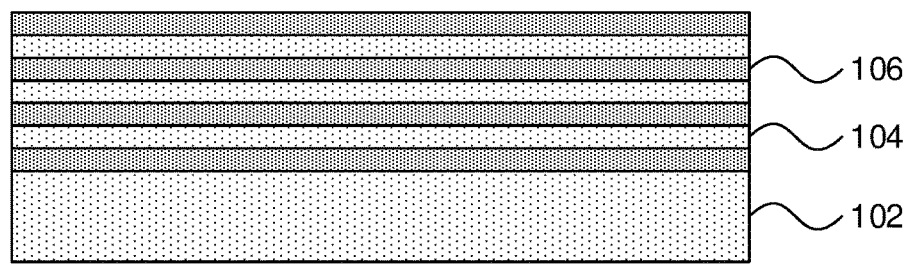
FIG. 1 is a cross-sectional view of a step in the formation of replacement-channel field effect transistors (FETs) where a stack of alternating sacrificial layers is shown in accordance with an embodiment of the present invention.

Referring now to the drawings in which like numerals represent the same or similar elements and initially to FIG. 1, a step in the formation of a FET is shown. A semiconductor substrate 102 is layered with alternating layers of initial channel material 104 and sacrificial material 106. The semiconductor substrate 102 may be a bulk-semiconductor substrate. It should be understood that the stack of initial channel layers 104 and sacrificial layers 106 can be sectioned into device regions, although only one such device region is shown herein. It is specifically contemplated that the alternating layers of initial channel material 104 and sacrificial material 106 are formed as sheets of material. It should be understood that the initial channel layers 104 are themselves sacrificial and simply occupy the position where the eventual III-V replacement channel will be formed.

It should be understood that, although nanosheet structures are handled specifically herein, the present embodiments may be applied to create nanowire or other structures as well. As used herein, the term "nanosheet" refers to a structure that has a ratio of its cross-sectional width to its cross-sectional height greater than about 2:1, whereas the term "nanowire" refers to a structure that has a ratio of its cross-sectional width to its cross-sectional height less than about 2:1.

In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. It should be recognized that, although it is specifically contemplated that a group IV semiconductor material will be used for the substrate 102, III-V semiconductor materials may also be used without altering the subsequent processes. Thus, although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

It is specifically contemplated that the alternating layers 104 and 106 are formed from different materials. In one particular embodiment, the layers of initial channel material 104 may be formed from, e.g., a silicon-containing semiconductor, with silicon itself being specifically contemplated, and the layers of sacrificial material may be formed from a silicon germanium composite. A germanium concentration of about 40% is specifically contemplated for the sacrificial material, but other concentrations may be used as well. In one particular embodiment, the layers of channel material 104 may be about 9 nm thick and the layers of sacrificial material may be about 12 nm thick, but it should be understood that other thicknesses may be used in accordance with design needs and fabrication process limitations.

The layers of initial channel material and sacrificial material 104 and 106 may be formed on the substrate 102 by any appropriate deposition process, but it is specifically contemplated that the layers may be sequentially grown epitaxially. In one particular embodiment, the substrate 102 has a surface crystal orientation of (110), and silicon germanium sacrificial material and silicon initial channel material is grown in alternation to create the stack of layers.

The term "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. Thus, being grown from a substrate 102 that has a surface crystal orientation of (110), each subsequent layer of sacrificial or initial channel material will also have a surface crystal orientation of (110).

Figure 2:
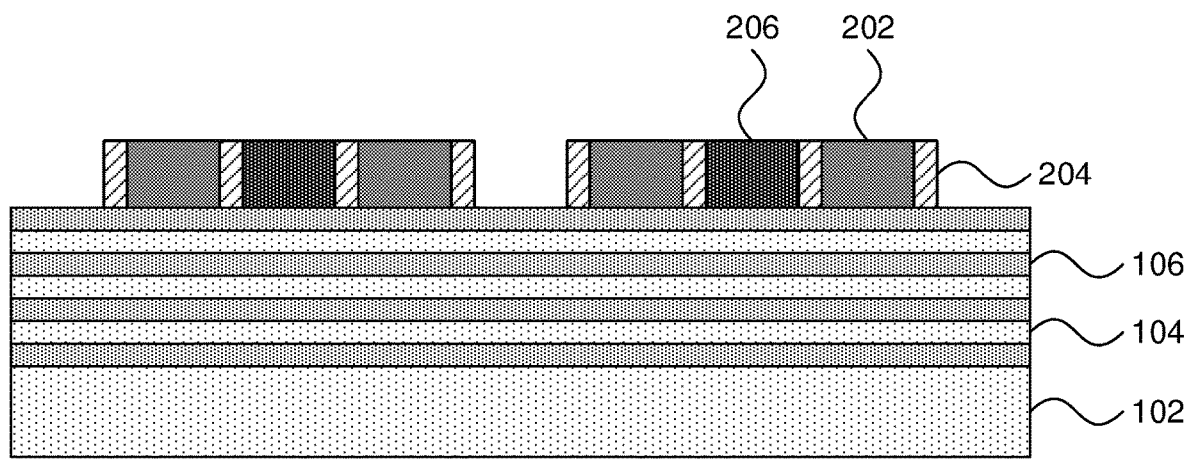
FIG. 2 is a cross-sectional view of a step in the formation of replacement-channel FETs where the stack of alternating sacrificial layers is patterned in accordance with an embodiment of the present invention.

Referring now to FIG. 2, a step in the formation of a FET is shown. First masks 202 are formed from any appropriate masking material such as, e.g., amorphous silicon. The first mask 202 may be formed by depositing a layer of masking material and then photolithographically etching the masking material to an appropriate size. Spacers 204 are then formed on sidewalls of the first masks 202 by, e.g., conformally depositing a spacer material such as silicon nitride and then by anisotropically etching away the spacer material from exposed horizontal surfaces. Second masks 206 are then formed between certain first masks 202 using a second masking material. It is specifically contemplated that a single second mask 206 will have a first mask 202 on either side, and that each first mask 202 will have unmasked region on the side of it that is farther away from the second mask 206. While any appropriate materials may be used for the first and second mask materials, it is specifically contemplated that the mask materials be selectively etchable with respect to one another. As used herein, the term "selective" in reference to a material removal process denotes that the rate of material removal for a first material is greater than the rate of removal for at least another material of the structure to which the material removal process is being applied.

The first and second mask materials and the spacer material may be formed by any appropriate deposition process. For example, the alternating layers may be formed by alternating deposition processes including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

An anisotropic etch, such as a reactive ion etch (RIE), may be used to pattern the first and second masks 202 and 206 as well as the spacers 204. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
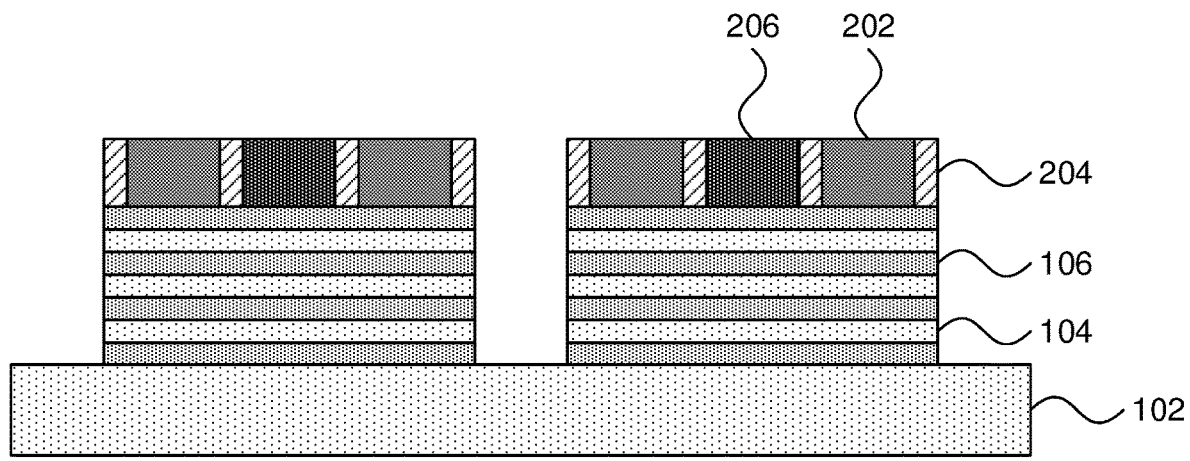
FIG. 3 is a cross-sectional view of a step in the formation of replacement-channel FETs where the stack of alternating sacrificial layers is etched according to the masked pattern in accordance with an embodiment of the present invention.

Referring now to FIG. 3, a step in the formation of a FET is shown. The first masks 202, second masks 206, and spacers 204 are used together as an etch mask to define device stack areas. An anisotropic etch is used to remove material from the exposed regions down to the substrate 102, leaving side surfaces of the initial channel layers 104 and the sacrificial layers 106 exposed.

Figure 4:
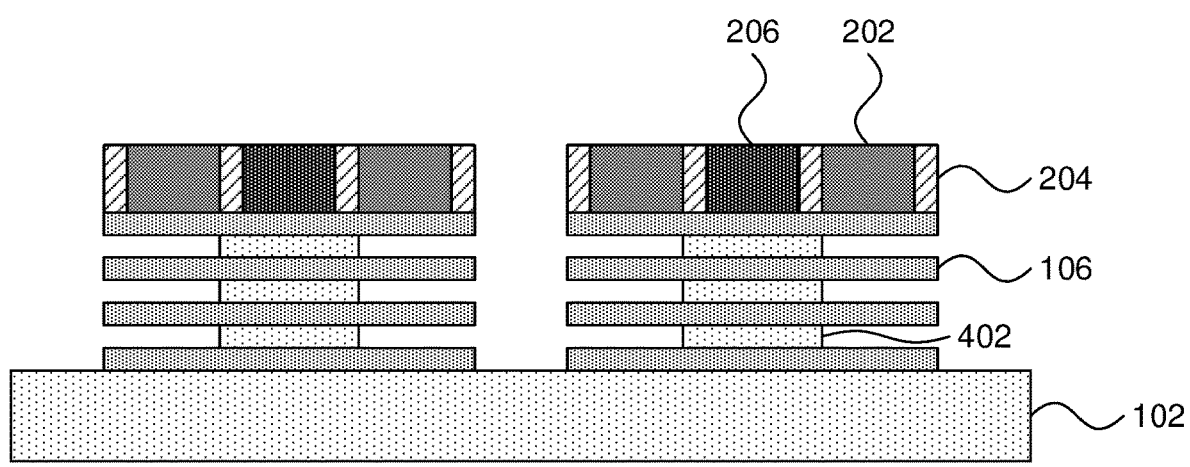
FIG. 4 is a cross-sectional view of a step in the formation of replacement-channel FETs where a first sacrificial material is recessed in accordance with an embodiment of the present invention.

Referring now to FIG. 4, a step in the formation of a FET is shown. The initial channel layers 104 are etched back with an isotropic wet or dry chemical etch to create recessed initial channel layers 402. The etch leaves smooth facing surfaces on the exposed walls of the recessed initial channel layers 402. It is specifically contemplated that these surfaces will have a (111) crystal orientation, though it should be understood that other crystal orientations are also contemplated. In embodiments where the initial channel layers 104 are formed from silicon, the etch may use tetramethylammonium hydroxide.

Figure 5:
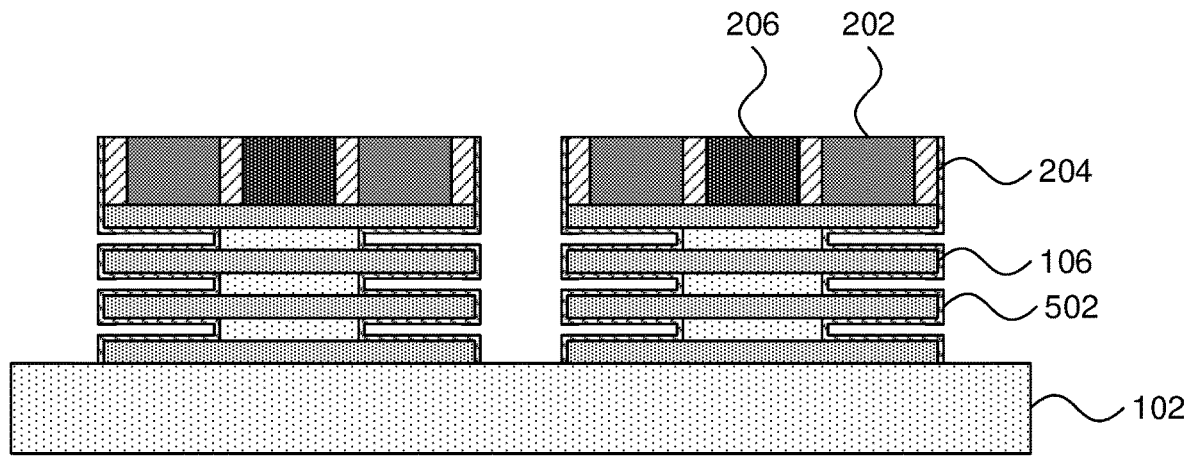
FIG. 5 is a cross-sectional view of a step in the formation of replacement-channel FETs where a conversion layer is conformally deposited in accordance with an embodiment of the present invention.

Referring now to FIG. 5, a step in the formation of a FET is shown. A conversion layer is conformally formed on the exposed surfaces of the recessed channel layers 402 and the sacrificial layers 106. It is specifically contemplated that the conversion layer 502 may be formed from germanium oxide ($GeO_2$) and that an ALD process may be used to deposit the conversion layer, but it should be understood that any appropriate conformal deposition (e.g., CVD) could be used instead. In the particular embodiment shown in FIG. 5, the conversion layer 502 has been shown as having been removed from horizontal surfaces using, e.g., a selective anisotropic etch, but it should be understood that other embodiments may leave the conversion layer 502 on these surfaces.

As can be seen, the conversion layer 502 coats the walls of the recesses left by recessed channel layers 402. It is contemplated that at least some cavity remains, providing fluid communication from the opening of the recess to the surface of the recessed channel layers 402.

Figure 6:
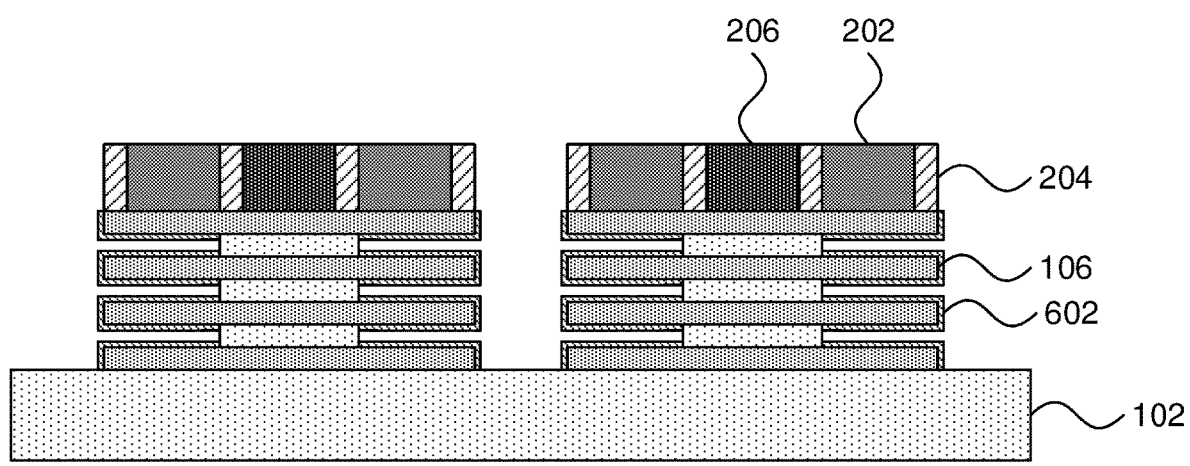
FIG. 6 is a cross-sectional view of a step in the formation of replacement-channel FETs where conversion layer is annealed to form a protective layer on the second sacrificial layers in accordance with an embodiment of the present invention.

Referring now to FIG. 6, a step in the formation of a FET is shown. An anneal is performed that causes the conversion layer 502 to convert into a silicon dioxide layer 602 in regions that are in contact with the sacrificial layers 106. In a particular embodiment, where the sacrificial layers 106 are formed from silicon germanium and where the conversion layer 502 is formed from germanium oxide, the germanium from the conversion layer diffuses into the sacrificial layers 106 and silicon condenses out, resulting in a protective layer 602 formed from silicon dioxide. The portion of the conversion layer 502 that is in contact with the recessed channel layers 402, spacer 204, and substrate 102 will not react and is washed away, leaving only the protective layer 602 remaining and exposing the sidewalls of the recessed channel layers 402.

It is specifically contemplated that, in some embodiments, the anneal may be performed at about 700° C. in a nitrogen ambient atmosphere, but it should be understood that other anneal parameters may be used instead to equal effect. The unreacted portions of the conversion layer 502 may be washed away with, e.g., deionized water.

Figure 7:
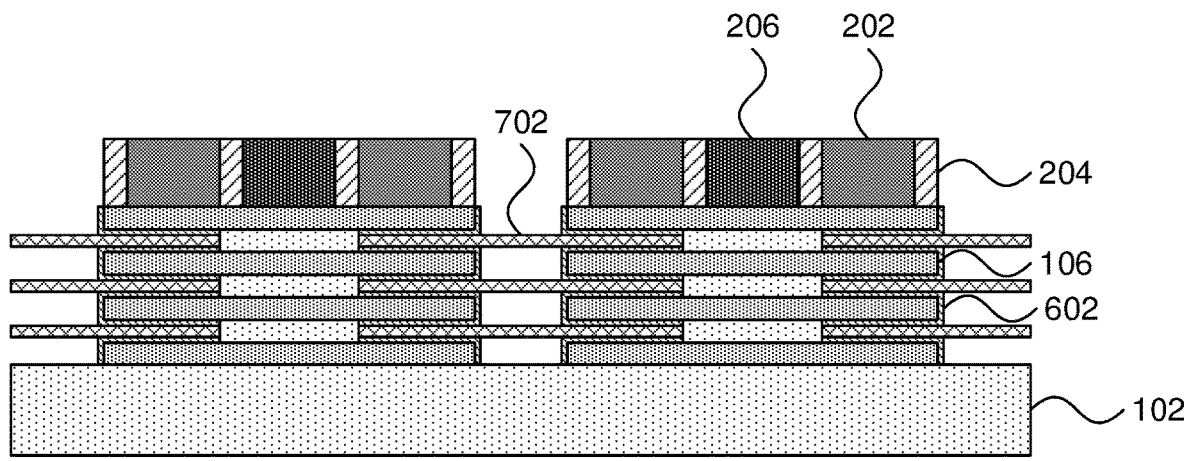
FIG. 7 is a cross-sectional view of a step in the formation of replacement-channel FETs where replacement channel layers are grown from sidewalls of the first sacrificial layers in accordance with an embodiment of the present invention.

Referring now to FIG. 7, a step in the formation of a FET is shown. A III-V layer 702 is selectively grown from the exposed sidewalls of the recessed initial channel layers 402. In one particular embodiment it is specifically contemplated that indium gallium arsenide may be used as a III-V semiconductor material for the III-V layer 702, as indium gallium arsenide will selectively grow from (111) silicon surfaces without depositing on, e.g., (110) surfaces. As noted above, the top surface of the substrate 102 is specifically contemplated as being a (110) surface and the exposed sidewalls of the recessed channel layers 402 are specifically contemplated as being (111) surfaces, resulting in III-V layers 702 that emerge from the recesses. Once the III-V layers 702 meet, the (111) surfaces are no longer exposed and the rapid growth stops. Although indium gallium arsenide is specifically contemplated, it should be understood that the present embodiments are not limited to that material as a III-V semiconductor.

Figure 8:
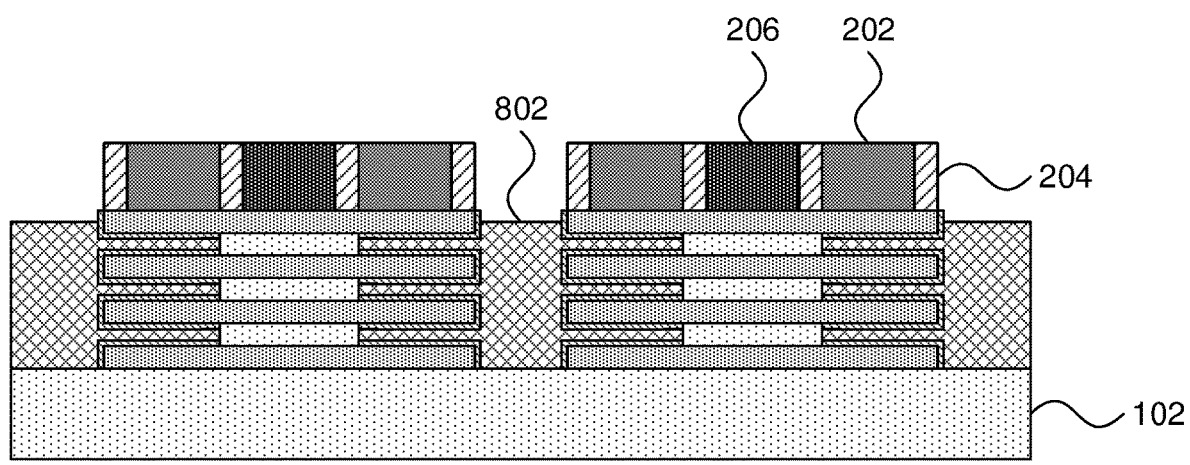
FIG. 8 is a cross-sectional view of a step in the formation of replacement-channel FETs where first source/drain regions are grown from the replacement channel layers in accordance with an embodiment of the present invention.

Referring now to FIG. 8, a step in the formation of a FET is shown. Drain structures 802 are epitaxially grown from the III-V layers 702. It is specifically contemplated that these drain structures 802 will be formed from the same III-V semiconductor material as the III-V layers 702. If the III-V layers 702 have successfully merged, this is a cladding process to form the drains structures 802. IF the III-V layers have not merged, then the second growth relies on growth from the substrate 102 as well as the exposed III-V layer ends to regrow the III-V material. This step may furthermore include in situ dopants for the drain structures 802. The dopant may be an n-type dopant (i.e., an element from Group IV or VI of the Periodic Table of Elements) or a p-type dopant (i.e., an element from Group II or VI of the Periodic Table of Elements). The concentration of dopant within the doped region can be between about $10^{11}$ and about $10^{15}$ atoms/cm$^2$.

Figure 9:
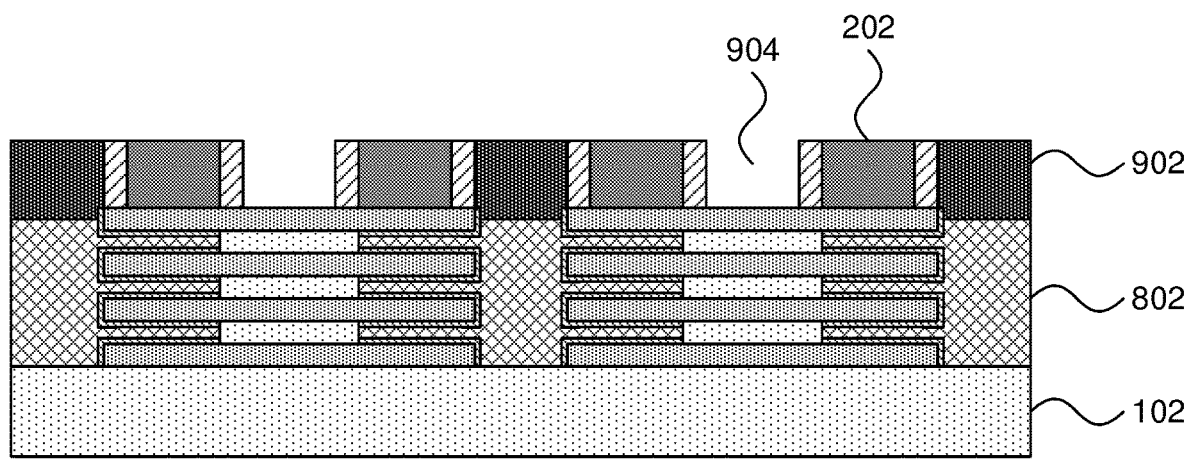
FIG. 9 is a cross-sectional view of a step in the formation of replacement-channel FETs where the mask is changed to expose a region over the remaining first sacrificial layers in accordance with an embodiment of the present invention.

Referring now to FIG. 9, a step in the formation of a FET is shown. The second mask 206 is etched away, exposing source regions 904. A third mask 902 is formed to cover the drain structures 802. The third mask 902 may be formed from the same material as second mask 206 or may be any other appropriate masking material that can be etched selectively relative to the first masks 202.

Figure 10:
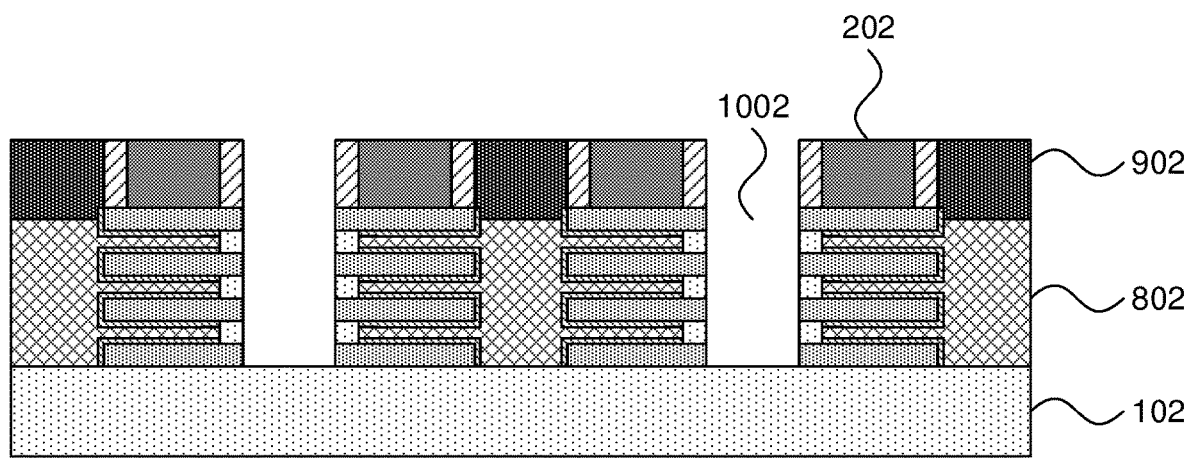
FIG. 10 is a cross-sectional view of a step in the formation of replacement-channel FETs where the stack is anisotropically etched in accordance with an embodiment of the present invention.

Referring now to FIG. 10, a step in the formation of a FET is shown. An anisotropic etch is used to etch away material in the source regions 904 to create gap 1002. Material from both the recessed initial channel layers 402 and the sacrificial layers 106 is selectively removed, leaving material that is protected by the first masks 202 and the third masks 902 intact.

Figure 11:
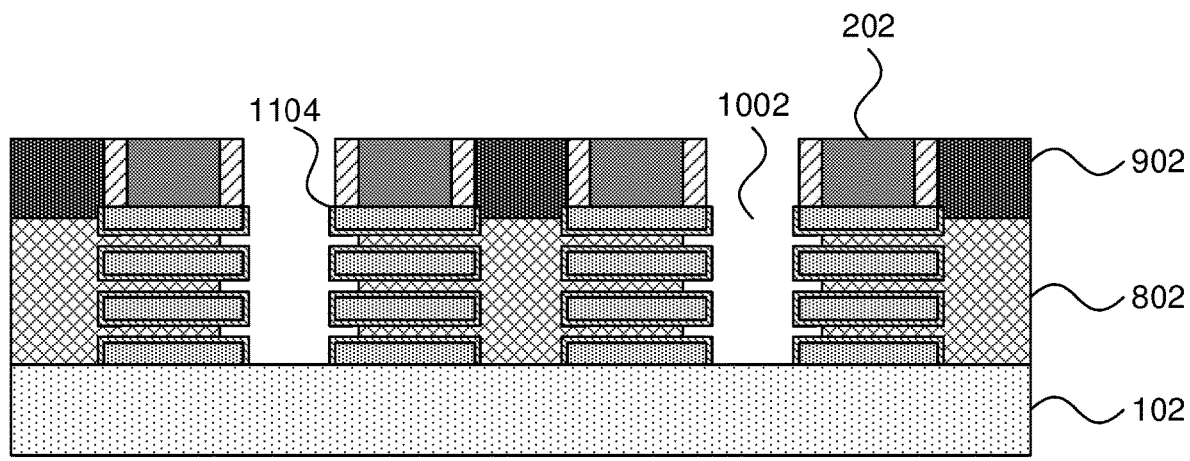
FIG. 11 is a cross-sectional view of a step in the formation of replacement-channel FETs where remaining first sacrificial material is removed and the protective layer is extended in accordance with an embodiment of the present invention.

Referring now to FIG. 11, a step in the formation of a FET is shown. Remaining material from the recessed initial channel layers is removed, expanding the gap 1102 and exposing sidewalls of the III-V layers 702. The silicon dioxide layer 602 is extended to cover the exposed portions of the sacrificial layers 106 as described above to form silicon dioxide layer 1104. Thus the silicon dioxide layer 1104 may be formed by depositing additional conversion material (such as germanium oxide), followed by an anneal to for silicon dioxide material on the exposed portions of the sacrificial layers 106, and then the remaining conversion material may be washed away.

Figure 12:
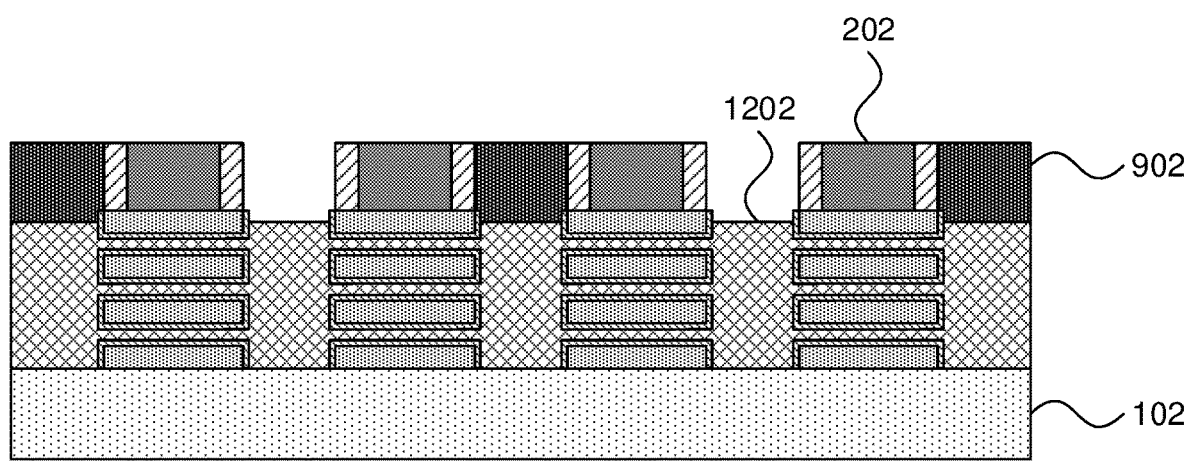
FIG. 12 is a cross-sectional view of a step in the formation of replacement-channel FETs where second source/drain regions are grown from the replacement channel layers in accordance with an embodiment of the present invention.

Referring now to FIG. 12, a step in the formation of a FET is shown. Source regions 1202 are grown from the exposed ends of the III-V layers using an epitaxial process. As noted above, it is specifically contemplated that these grown structures may be formed from indium gallium arsenide, but it should be understood that the source structures 1202, the drain structures 802, and the III-V layers 702 may all be formed from any appropriate semiconductor material and, particularly, from any appropriate III-V semiconductor material.

Figure 13:
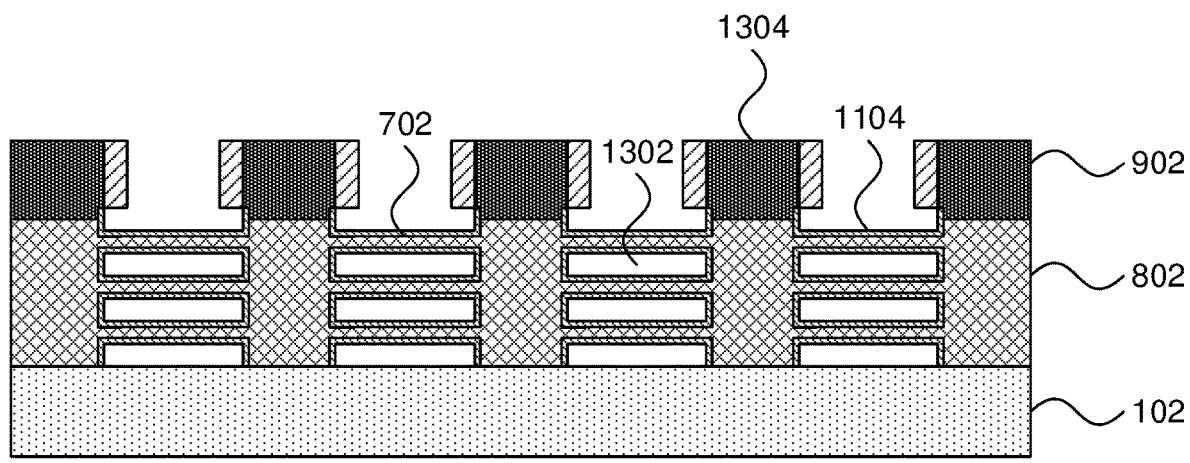
FIG. 13 is a cross-sectional view of a step in the formation of replacement-channel FETs where the second sacrificial layers are etched away in accordance with an embodiment of the present invention.

Referring now to FIG. 13, a step in the formation of a FET is shown. Additional dielectric fill 1304 is added and the first masks 202 are removed. In one embodiment, this removal can be performed using, e.g., The sacrificial layers 106 are then etched away, exposing the oxide surfaces 1104 exposed, with gaps 1302 between and around the III-V layers 702. The sacrificial layers 106 can be removed using a wet or dry chemical etch (e.g., hydrochloric acid) that selectively removes the material of the sacrificial layers 106 without affecting the III-V semiconductor material.

Figure 14:
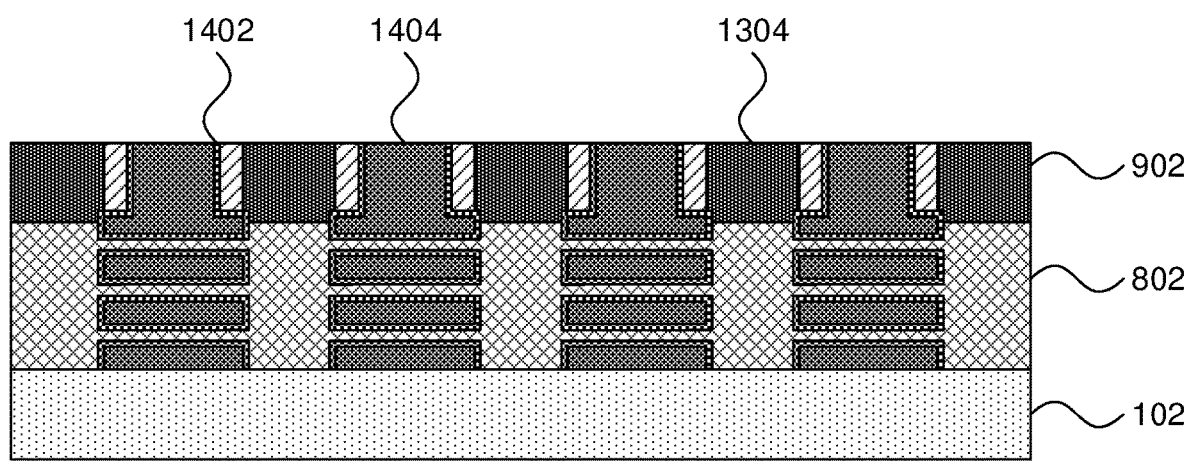
FIG. 14 is a cross-sectional view of a step in the formation of replacement-channel FETs where a gate stack is formed in accordance with an embodiment of the present invention.

Referring now to FIG. 14, a step in the formation of a FET is shown. The oxide layer 1104 is removed using a selective wet or dry chemical etch. A gate stack is then conformally deposited on and around the III-V layers 702. The gate stack includes, e.g., a gate dielectric layer 1402 and a gate conductor 1404. A work function metal (not shown) and other structures may optionally be included as well.

It is specifically contemplated that the gate dielectric layer 1402 may be formed from a high-k dielectric material, though it should be understood that other materials may be used instead. High-k dielectric materials are defined as materials having a dielectric constant k that is greater than the dielectric constant of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric material may further include dopants such as lanthanum and aluminum.

The gate conductor 1404 may be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor 1404 may alternatively be formed from a doped semiconductor material such as, e.g., doped polysilicon.

At this point, additional processing steps may be used to finish the device or devices. Although multiple devices that share source/drain structures are shown, these structures may be separated to isolate a single device or may, alternatively, be kept intact to have multiple devices that share a single source or drain. Finishing the device may therefore include anisotropically removing material to isolate the device and filling the resulting gap with a dielectric barrier. A passivating layer may be deposited with vias providing electrical connections to the source and drain structures 1202 and 802 and to the gate conductor 1404. The spacers 204 remain and act as sidewall spacers for the gate stack. Notably, the gate stack extends laterally beneath the spacers 204 in the final device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 15:
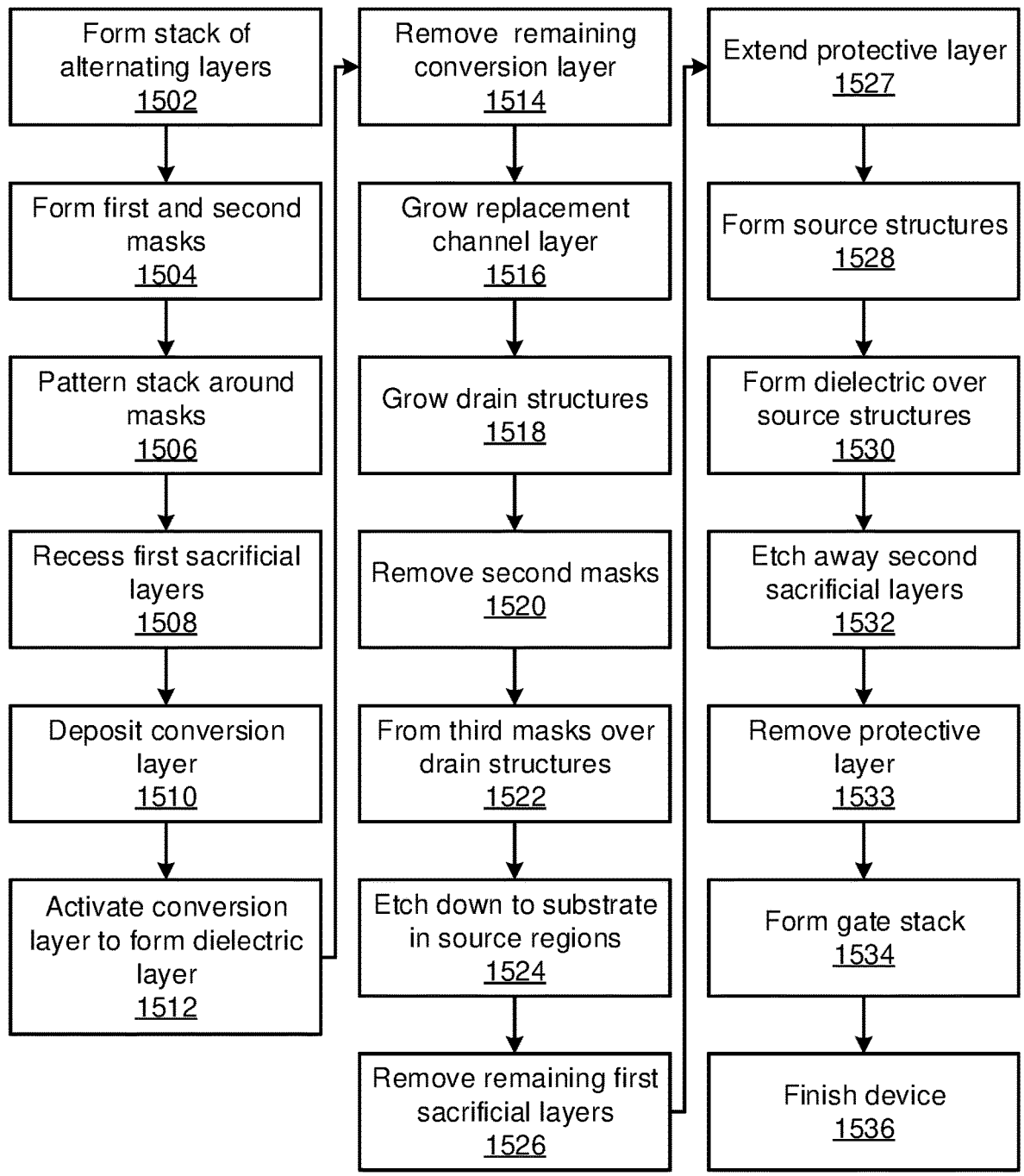
FIG. 15 is a block/flow diagram of a replacement channel process for fabricating III-V semiconductor channel FETs in accordance with an embodiment of the present invention.

Referring now to FIG. 15, a method of forming a FET is shown. Block 1502 forms a stack of alternating sacrificial layers, including first sacrificial layers 104 and second sacrificial layers 106. It is specifically contemplated that the stack of alternating sacrificial layers may be grown epitaxially from the substrate 102, with the first sacrificial layers 104 being formed from silicon and with the second sacrificial layers being formed from silicon germanium.

Block 1504 forms first and second masks. First masks 202 are formed first from a first masking material, being deposited by any conformal deposition process and subsequently photolithographically patterned to cover portions of the stack that correspond to channel regions of the ultimate device(s). Spacers 204 are then formed on sidewalls of the first masks 202 by a conformal deposition process followed by an anisotropic etch process that removes spacer material from exposed horizontal surfaces. The second masks 206 are formed in a manner similar to that of the first masks 202, where the second mask material is deposited and subsequently removed from areas outside of specified regions. The second masks 206 specifically cover portions of the stack that correspond to source regions of the ultimate device(s). It should be understood that, although source and drain regions have been specified herein, the "source" and "drain" designations of these regions can be exchanged with no functional effect on the resulting device(s).

Block 1506 patterns the stack of alternating sacrificial layers around the first masks 202, spacers 204, and second masks 206. This etch is an anisotropic etch that selectively removes the material of the alternating sacrificial layers down to the substrate 102. This may be performed in one timed etch or in alternating selective etches to preserve the first sacrificial layers 104 and second sacrificial layers 106.

Block 1508 recesses the first sacrificial layers 104 to form recessed first sacrificial layers 402. This recessing step may be performed using any appropriate wet or dry chemical etch. Block 1510 deposits a conversion layer 502 on the exposed surfaces of the recessed first sacrificial layers 402 and the second sacrificial layers 106. In some embodiments, the conversion layer 502 may be formed from germanium oxide.

Block 1510 activates the conversion layer 502 to form a protective dielectric layer 602. In some embodiments, the conversion layer 502 may be activated by an anneal that oxidizes silicon in the second sacrificial layers 106 and that causes germanium from the conversion layer 502 to diffuse into the sacrificial layers 106. Following these embodiments, the resulting protective dielectric layer 602 is formed from silicon dioxide, though other materials are also contemplated.

Block 1514 removes remaining material from the conversion layer 502 using, for example, an appropriate wet or dry chemical etch or wash. This exposes the sidewalls of the recessed first sacrificial layers 402. Block 1516 then grows replacement channel layer 702 from the exposed sidewalls of the recessed first sacrificial layers 402. In specifically contemplated embodiments, the exposed sidewalls of the recessed first sacrificial layers 402 will have a crystalline orientation of (110) and the material of the replacement channel layers 702 will be indium gallium arsenide, but it should be understood that other crystalline structures and other replacement channel materials are also contemplated. Block 1518 then grows drain structures 802 from the replacement channel structures 702.

Block 1520 removes the second masks 206 and block 1522 forms third masks 902 over the drain structures 802. Block 1524 etches down to the substrate 102 in regions that are not covered by the first masks 202, the spacers 204, or the third masks 902 using one, timed anisotropic etch or alternating selective anisotropic etches. Block 1526 removes any material from the recessed first sacrificial layers 402 that remains after the etch of block 1524 using any appropriate wet or dry chemical etch. Block 1528 then grows source structures 1202 from the existing channel structures 702 using an epitaxial growth process. Block 1527 then extends the protective layer 602 to form protective layer 1104 using the same process of depositing a conversion layer and activating the conversion layer as is set forth above.

Block 1530 forms additional dielectric material 1304 over the source structures 1202. removes the first masks 202 using any appropriate process. This may include, for example, a deposition of dielectric material by any appropriate process followed by a CMP process that stops on the spacers 204. Block 1532 etches away the second sacrificial layers 106 and block 1533 etches away the protective layer 1104, leaving exposed the replacement channel layers 702. Block 1534 forms a gate stack through the conformal deposition of a gate dielectric layer 1402 and a gate conductor 1404. Block 1536 then finishes the device(s) by depositing a passivating layer and forming conductive contacts through the passivating layer to connect to the source and drain regions and the gate conductor.

Having described preferred embodiments of replacement-channel fabrication of III-V nanosheet devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    recessing first sacrificial layers relative to second sacrificial layers in a stack of alternating first and second sacrificial layers;
    growing replacement channel layers from sidewalls of the first sacrificial layers;
    growing source/drain regions from the replacement channel layers;
    etching away the first sacrificial layers and the second sacrificial layers; and
    forming a gate stack between, around, and in direct contact with the replacement channel layers and in contact with upper and lower surfaces of the replacement channel layers.

2. The method of claim 1, further comprising forming a protective layer on the second sacrificial layers before growing the replacement channel layers.

3. The method of claim 2, wherein forming the protective layer comprises depositing a layer of conversion material and annealing the layer of conversion material.

4. The method of claim 3, further comprising removing remaining conversion material after the anneal to expose sidewalls of the recessed first sacrificial layers.

5. The method of claim 3, wherein the layer of conversion material is formed from germanium oxide and the second sacrificial layers are formed from silicon germanium.

6. The method of claim 1, further comprising growing the stack of alternating first and second sacrificial layers from a substrate having a top surface with a (110) crystal orientation.

7. The method of claim 6, wherein the sidewalls of the first sacrificial layers have a (111) crystal orientation.

8. The method of claim 1, wherein the first sacrificial layers are formed from silicon and the replacement channel layers are formed from indium gallium arsenide.

9. The method of claim 1, wherein the first sacrificial layers and the second sacrificial layers are formed from group IV semiconductor materials and wherein the replacement channel layers are formed from a III-V semiconductor material.

10. A method for forming a semiconductor device, comprising:
    recessing first sacrificial layers relative to second sacrificial layers in a stack of alternating first and second sacrificial layers;
    forming a protective layer on the second sacrificial layers by depositing a layer of conversion material and annealing the layer of conversion material;
    growing replacement channel layers from sidewalls of the first sacrificial layers;
    growing source/drain regions from the replacement channel layers;
    etching away the first sacrificial layers and the second sacrificial layers; and
    forming a gate stack between, around, and in direct contact with the replacement channel layers and in contact with upper and lower surfaces of the replacement channel layers.

11. The method of claim 10, further comprising removing remaining conversion material after the anneal to expose sidewalls of the recessed first sacrificial layers.

12. The method of claim 10, wherein the layer of conversion material is formed from germanium oxide and the second sacrificial layers are formed from silicon germanium.

13. The method of claim 10, further comprising growing the stack of alternating first and second sacrificial layers from a substrate having a top surface with a (110) crystal orientation.

14. The method of claim 13, wherein the sidewalls of the first sacrificial layers have a (111) crystal orientation.

15. The method of claim 10, wherein the first sacrificial layers are formed from silicon and the replacement channel layers are formed from indium gallium arsenide.

16. The method of claim 10, wherein the first sacrificial layers and the second sacrificial layers are formed from group IV semiconductor materials and wherein the replacement channel layers are formed from a III-V semiconductor material.

17. A method for forming a semiconductor device, comprising:
    growing a stack of alternating first and second sacrificial layers from a substrate having a top surface with a (110) crystal orientation;

recessing first sacrificial layers relative to second sacrificial layers in the stack of alternating first and second sacrificial layers;

growing replacement channel layers from sidewalls of the first sacrificial layers, wherein the sidewalls of the first sacrificial layers have a (111) crystal orientation;

growing source/drain regions from the replacement channel layer;

etching away the first and second sacrificial layers; and forming a gate stack between, around, and in direct contact with the replacement channel layers and in contact with upper and lower surfaces of the replacement channel layers.

18. The method of claim 17, forther comprising forming a protective layer on the second sacrificial layers before growing the replacement channel layers by depositing a layer of conversion material, annealing the layer of conversion material, and removing remaining conversion material after the anneal to expose sidewalls of the recessed first sacrificial layers.

19. The method of claim 18, wherein the layer of conversion material is formed from germanium oxide and the second sacrificial layers are formed from silicon germanium.

20. The method of claim 17, wherein the first sacrificial layers are formed from silicon and the replacement channel layers are formed from indium gallium arsenide.

* * * * *